US009596776B2

(12) United States Patent
Takahashi et al.

(10) Patent No.: US 9,596,776 B2
(45) Date of Patent: Mar. 14, 2017

(54) ELECTRICAL APPARATUS

(71) Applicant: HITACHI KOKI CO., LTD., Tokyo (JP)

(72) Inventors: Shigeru Takahashi, Hitachinaka (JP); Masanori Watanabe, Hitachinaka (JP); Takafumi Itoh, Hitachinaka (JP); Jyunichi Suzuki, Hitachinaka (JP)

(73) Assignee: HITACHI KOKI CO., LTD., Tokyo (JP)

( * ) Notice: Subject to any disclaimer, the term of this patent is extended or adjusted under 35 U.S.C. 154(b) by 0 days.

(21) Appl. No.: 14/610,906

(22) Filed: Jan. 30, 2015

(65) Prior Publication Data
US 2015/0282356 A1 Oct. 1, 2015

(30) Foreign Application Priority Data

Mar. 31, 2014 (JP) ................................. 2014-072332

(51) Int. Cl.
*F21V 21/06* (2006.01)
*F21V 21/30* (2006.01)
(Continued)

(52) U.S. Cl.
CPC ......... *H05K 5/0247* (2013.01); *F04D 19/002* (2013.01); *F04D 25/0673* (2013.01);
(Continued)

(58) Field of Classification Search
CPC ...... H05K 5/0086; H05K 5/02; H05K 5/0247; F16M 11/10; F16M 2200/08; F21V 23/06;
(Continued)

(56) References Cited

U.S. PATENT DOCUMENTS 2,830,779 A * 4/1958 Wentling ............. F04D 29/646
248/137
4,120,615 A * 10/1978 Keem ................... F04D 29/526
220/324
(Continued)

FOREIGN PATENT DOCUMENTS

EP 2806206 A1 11/2014
JP S59-196596 U 12/1984

OTHER PUBLICATIONS

European Search Report EP Application No. 15153553.1 dated Aug. 12, 2015.
(Continued)

*Primary Examiner* — Hargobind S Sawhney
(74) *Attorney, Agent, or Firm* — McDermott Will & Emery LLP

(57) ABSTRACT

In order to provide the electrical apparatus capable of improving the handleability, the electrical apparatus of the present invention includes the fan main body portion converting electrical power into wind to output the converted wind from a front face side to an outside of the fan main body portion, the pair of side frames supporting the fan main body portion, the pair of bottom frames extending from lower ends of the side frames to a rear side, the connecting frame connecting the pair of bottom frames, and the battery retaining portion having a rechargeable battery for supplying electrical power to the fan main body portion detachably attached thereto, where the battery retaining portion is provided in the connecting frame and disposed with a space from an air inlet port at a rear face of the tan main body portion.

11 Claims, 13 Drawing Sheets

(51) Int. Cl.
*H05K 5/02* (2006.01)
*H05K 5/00* (2006.01)
*F04D 25/06* (2006.01)
*F04D 25/08* (2006.01)
*F16M 11/10* (2006.01)
*F16M 13/02* (2006.01)
*F04D 19/00* (2006.01)

(52) U.S. Cl.
CPC ............. *F04D 25/08* (2013.01); *F16M 11/10* (2013.01); *F16M 13/022* (2013.01); *H05K 5/0086* (2013.01); *H05K 5/02* (2013.01)

(58) Field of Classification Search
CPC ...... F21V 21/145; F21V 21/06; F21V 21/116; F21V 21/14; F21V 21/30; F24F 7/025; F24F 7/007; F24F 2221/17; F24F 2221/20; F04D 29/545; F04D 29/526; F04D 25/08; F04D 25/084; F04D 25/0673; F04D 25/0606; F04D 29/263; F04D 29/646; F04D 19/002; F21L 14/00; F21L 4/00; F21L 14/02; F21L 4/02; Y02B 10/24; Y10S 454/90; Y10T 403/32426; F21S 9/02
See application file for complete search history.

(56) References Cited

U.S. PATENT DOCUMENTS

| | | | | |
|---|---|---|---|---|
| 4,222,318 | A | * | 9/1980 | Patton .................... F04D 25/08 248/126 |
| 4,657,483 | A | * | 4/1987 | Bede ...................... F04D 29/545 415/210.1 |
| 6,126,415 | A | * | 10/2000 | Lasko ................... F04D 29/646 416/146 R |
| 6,589,018 | B2 | * | 7/2003 | Chen ..................... F04D 29/263 310/71 |
| D610,673 | S | | 2/2010 | Sterpka et al. |
| 7,850,513 | B1 | * | 12/2010 | Parker ................ F04D 25/0606 136/245 |
| 2004/0179361 | A1 | | 9/2004 | Hussaini et al. |
| 2012/0269663 | A1 | | 10/2012 | Kamiya et al. |
| 2013/0010471 | A1 | * | 1/2013 | Dalsgaard .............. F21V 21/30 362/249.1 |

OTHER PUBLICATIONS

Metabowerke GMbH: "Put into the right perspective (press release)", Internet Citation, Mar. 18, 2013, XP002731356, Retrieved from the Internet: URL:http://www.metabo.com/Archives.2022+M5b796f75a61.0.html Retrieved Oct. 17, 2014, whole document.

\* cited by examiner

ELECTRICAL APPARATUS

CROSS-REFERENCE TO RELATED APPLICATION

The present application claims priority from Japanese Patent Application No. 2014-072332 filed on Mar. 31, 2014, the content of which is hereby incorporated by reference into this application.

TECHNICAL FIELD OF THE INVENTION

The present invention relates particularly to an electrical apparatus for converting electrical power accumulated in a rechargeable battery into either one of light, wind, heat, and sound, and outputting the converted one to an outside of the electrical apparatus.

BACKGROUND OF THE INVENTION

For example, an electric fan that is an electrical apparatus used in a severe and troublesome site, such as a work site, is desired to be compact, ht in weight, and easy to handle. For example, an electric fan carried with an electric fan main body housed in a case and used with the electric fan main body mounted on the case opened has been suggested (for example, see Japanese Utility Model Application Laid-Open Publication No. S59-196596: Patent Document 1).

SUMMARY OF THE INVENTION in recent years, along with the requirement for further improvement, of handleability, or the improvement of the performance of rechargeable batteries, development of electrical apparatuses toward cordless is advanced, and, for example, a cordless fan for converting electrical power accumulated in the rechargeable battery into wind to output the converted wind has been suggested. The handleability of such a cordless fan, namely, an electrical apparatus, is required to be further improved.

In view of these circumstances, the present invention has been made and an object thereof is to provide an electrical apparatus capable of improving the handleability.

According to aspect of the present invention, an electrical apparatus includes: a first frame portion brought in contact with an installation surface in an ordinary state; a second frame portion joined to the first frame portion and disposed substantially parallel with respect to the first frame portion; and a battery retaining portion provided in the first frame portion and having a rechargeable battery attached thereto. The electrical apparatus is configured to be able to be used in a state where the first frame portion is installed on the installation surface, and where the rechargeable battery attached to the battery retaining portion and the second frame portion are installed on the installation surface.

According to another aspect of the present invention, an electrical apparatus includes: a first frame portion brought in contact with an installation surface in an ordinary state; and a battery retaining portion provided in the first frame portion and having a rechargeable battery attached thereto. The electrical apparatus is configured to be able to be used in a state where the first frame portion is installed on the installation surface, and where only the rechargeable battery attached to the battery retaining portion is installed on the installation surface.

According to another aspect of the present invention, an electrical apparatus includes: a main body portion converting electrical power into either one of light, wind, heat, and sound to output the converted one from a front face side to an outside of the main body portion; a pair of side frames supporting the main body portion; a pair of bottom frames extending from lower ends of the pair of side frames to a rear side; a connecting frame connecting the pair of bottom frames; and a battery retaining portion having a rechargeable battery for supplying electrical power to the main body portion detachably attached thereto. The battery retaining portion is provided in the connecting frame and disposed having a space from a rear face of the main body portion.

According to another aspect of the present invention, an attachment portion for the rechargeable battery is formed at a rear side of the battery retaining portion.

According to another aspect of the present invention, in a self-standing state of the electrical apparatus where the pair of bottom frames are grounded, a center of gravity of the rechargeable battery attached to the battery retaining portion is disposed lower than a point where the main body portion is supported by the pair of side frames.

According to another aspect of the present invention, the main body portion is pivotally supported by each of support mechanism portions built in the pair of side frames.

According to another aspect of the present invention, partially-cylindrical recesses having an axial direction substantially parallel with respect to a supporting shaft of the main body portion supported by the pair of side frames are formed at upper faces of the pair of bottom frames in vicinity of the connecting frame.

According to another aspect of the present invention, a face of the battery retaining portion positioned on the side of the main body portion is formed so as to be continuous from the recesses in a direction of increasing a distance from the bottom frames.

According to another aspect of the present invention, a face of the battery retaining portion positioned on the side of the main body portion is formed such that a distance from the main body portion is increased from a proximal end of the battery retaining portion to a distal end thereof.

According to another aspect of the present invention, an electrical apparatus includes: a main body portion converting electrical power into either one of light, wind, heat, and sound to output the converted one from a front face side to an outside of the main body portion; a frame portion having a pair of side frames supporting the main body portion, a pair of bottom frames extending from lower ends of the pair of side frames to a rear side, and a connecting frame connecting the pair of bottom frames; and a battery retaining portion provided in the frame portion and having a rechargeable battery for supplying electrical power to the main body portion detachably attached thereto. The frame portion between the battery retaining portion and the main body portion functions as a hook portion so as to be hung on an external member.

According to another aspect of the present invention, in a state where the bottom frames are grounded, the side frames and the battery retaining portion are configured to extend upward, and the hook portion is configured to be located in a space formed by the main body portion, the battery retaining portion, and the frame portion.

According to another aspect of the present invention, the hook portion is provided in a connecting portion between the bottom frame and the battery retaining portion.

According to another aspect of the present invention, a front face side of the battery retaining portion is inclined rearward with respect to the bottom frames.

According to another aspect of the present invention, the hook portion is provided in a connecting portion between the side frame and the bottom frame.

According to the present invention, the advantageous effect that the handleability can be improved is achieved.

BRIEF DESCRIPTIONS OF THE DRAWINGS

DESCRIPTIONS OF THE PREFERRED EMBODIMENTS

Figure 1:
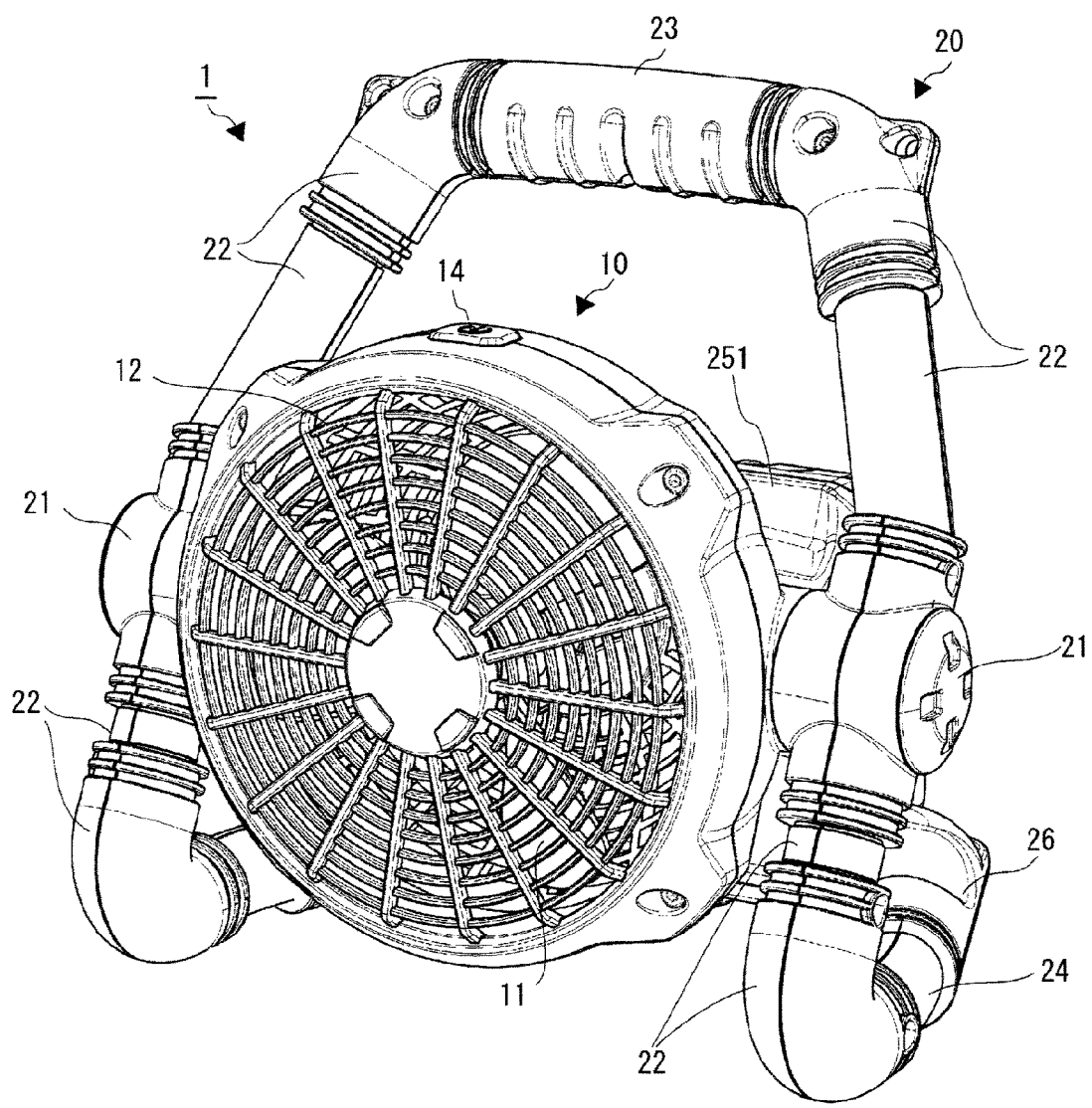
FIG. 1 is a perspective view showing a configuration of an embodiment of a cordless fan that is an electrical apparatus according to the present invention.

Next, an embodiment of the present invention will be specifically described with reference to the drawings. The same or equivalent constituting elements, members and processing illustrated in each drawing shall be denoted by the same reference numerals, and the repeated explanations will be omitted appropriately.

Figure 2:
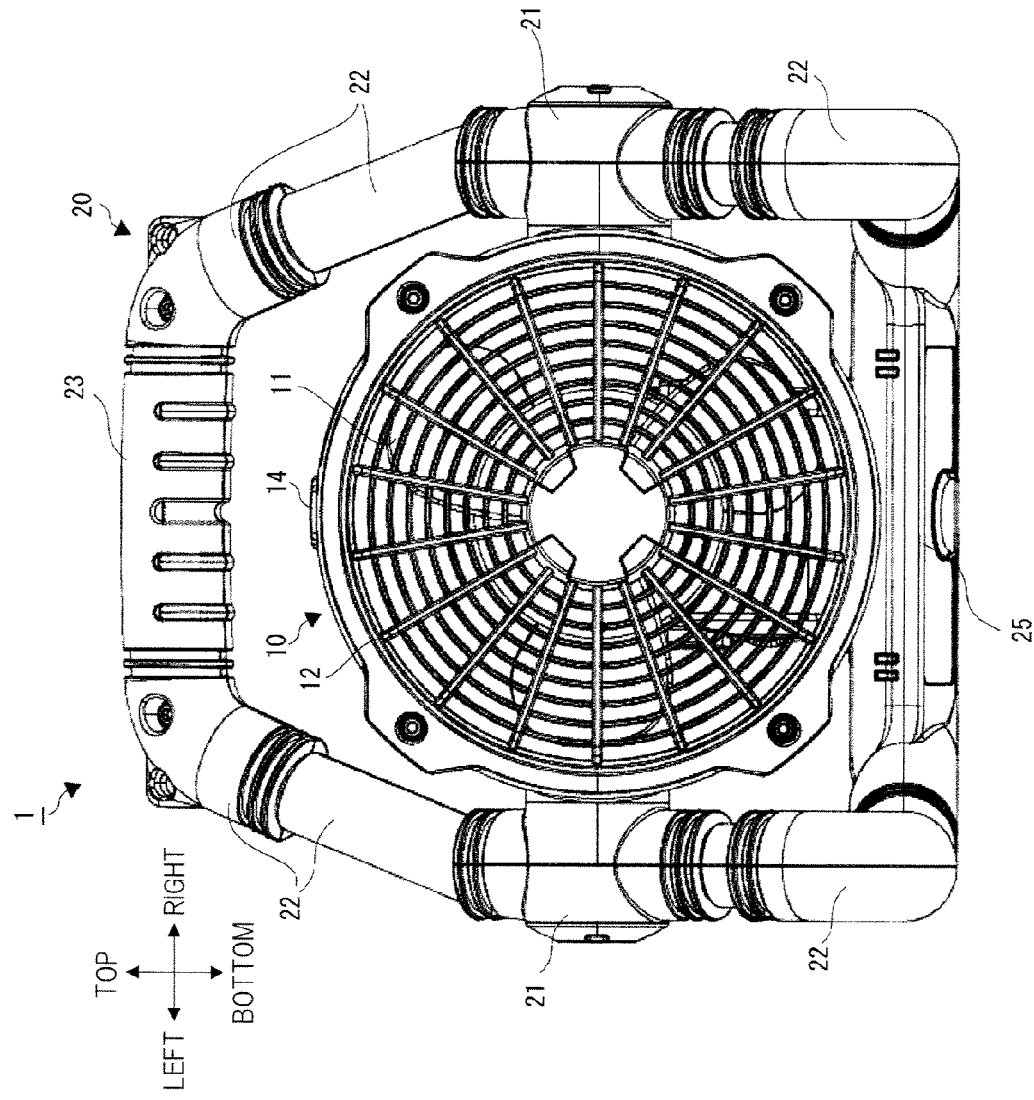
FIG. 2 is a front view showing the configuration of the cordless fan shown in FIG. 1.
Figure 3:
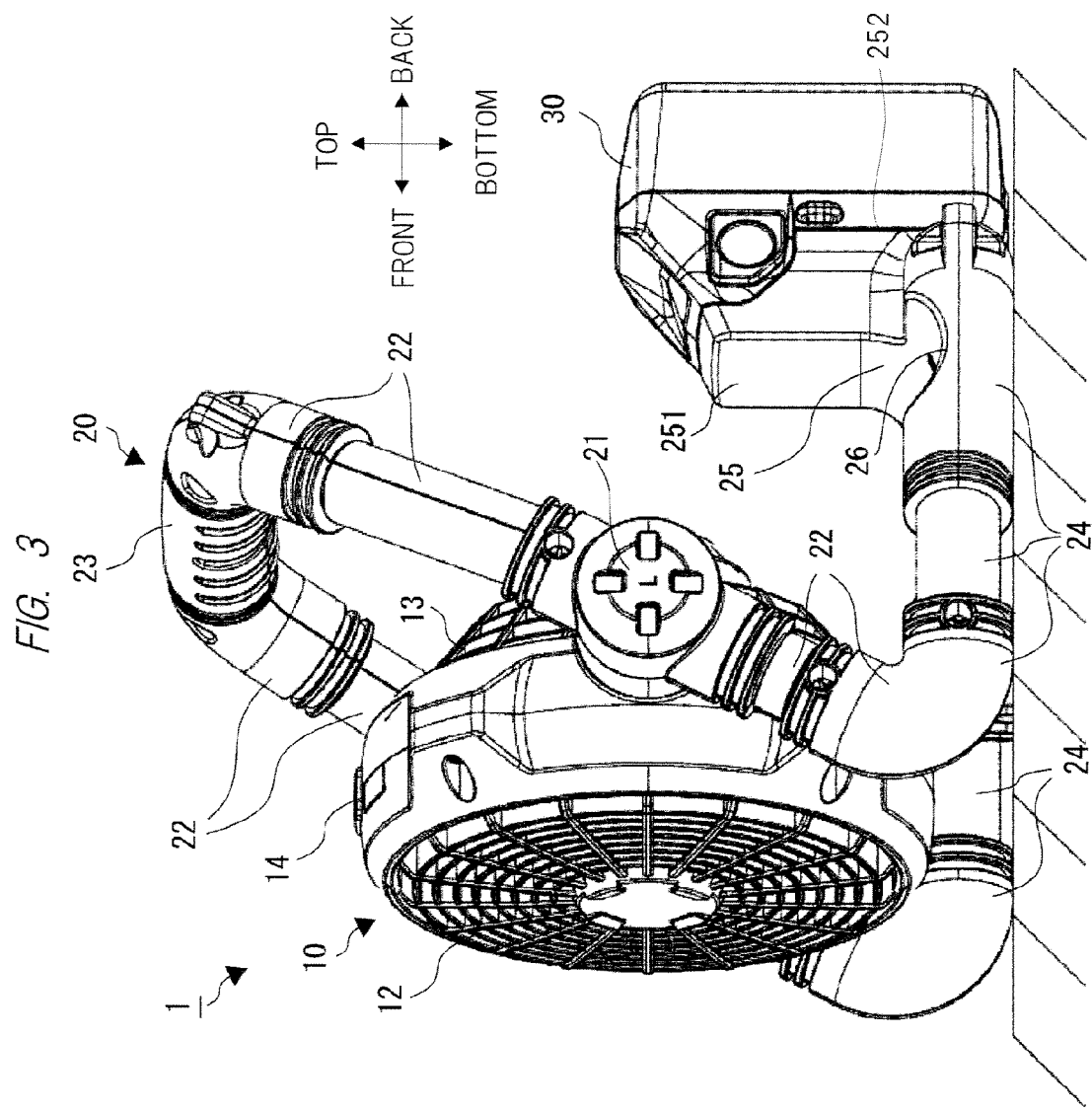
FIG. 3 is a perspective view showing a self-standing state of the cordless fan shown in FIG. 1 where bottom frames of the cordless fan are grounded.

An electrical apparatus of an embodiment of the present invention is a cordless fan 1 for converting electrical power into wind to output the converted wind to an outside of the electrical apparatus. With reference to FIGS. 1 to 3, the cordless fan 1 is composed of a fan main body portion 10 having a fan 11 and a built-in motor (not shown) for rotating the fan 11, and a frame portion 20 surrounding the fan main body portion 10 and guarding the fan main body 10.

As a hollow-disk-like housing having the fan 11 and the built-in motor (not shown), the fan main body portion 10 is provided with a front face cover member 12 functioning as an air outlet port and a back face cover member 13 functioning as an air inlet port. A switch 14 for controlling on and off of the fan 11 is provided at the top of the fan main body portion 10.

The frame portion 20 is disposed on both side faces of the fan main body portion 10, and composed of a pair of side frames 22 guarding the side faces of the fan main body portion 10, a top frame 23 connecting upper ends of the pair of side frames 22, a pair of bottom frames 24 extending from lower ends of the pair of side frames 22 to rear side and functioning as feet, and a connecting frame 25 connecting rear ends of the pair of bottom frames 24, and the side frames 22, the top frame 23, the bottom frames 24, and the connecting frame 25 are unified so as not to be displaced relative to each ether.

As shown in FIG. 2, when a front face of the fan main body portion 10 is viewed from the front face cover member 12 side, the pair of side frames 22 are each located on left and right sides of the fan main body portion 10, the top frame 23 is located above the fan main body portion 10, and the bottom frames 24 are located below the fan main body portion 10. A support mechanism portion 21 is built in a part of the side frame 22. A pivot shaft (support shaft) (not shown) provided on the side face of the fan main body portion 10 is pivotally supported by the support mechanism portion 21 substantially perpendicularly with respect to the side frame 22. The top frame 23 and the connecting frame 25 are disposed substantially parallel with respect to the pivot shaft of the fan main body portion 10, and disposed at positions where the top frame 23 and the connecting frame 25 are not brought into contact with the fan main body portion 10 pivotally supported by the support mechanism portion 21 even when the fan main body portion 10 pivots around the pivot shaft, that is, outside a pivoting region of the fan main body portion 10.

The cordless fan 1, as shown in FIG. 3, is configured to be able to stand alone in a state where the bottom frames 24 is installed (grounded) on an installation surface. The connecting frame 25 is provided with a battery retaining portion 251 having a rechargeable battery 30 housing a plurality of battery cells, such as nickel-metal hydride cells or lithium-ion cells detachably attached thereto. The battery retaining portion 251 projects substantially upward from the rear end of the bottom frame 24 in a side view shown in FIG. 3. An attachment portion 252 having the rechargeable battery 30 detachably attached thereto is formed on a rear side of the battery retaining portion 251. Attaching the rechargeable battery 30 onto the attachment portion 252 of the battery retaining portion 251 is configured to be performed in a sliding manner from above to the attachment portion 252, so that a user can easily attach the rechargeable battery 30 to or detach the same from the cordless fan 1 in a state where the bottom frames 24 is grounded to cause the cordless fan 1 to stand alone, while viewing the attachment portion 252 of the battery retaining portion 251.

The side frame 22 and the bottom frame 24 are connected in a substantially L shape in the side view shown in FIG. 3 and an angle between the side frame 22 and the bottom frame 24 is set at an acute angle (substantially 60 degrees in this embodiment). Therefore, a center of gravity of the fan main body portion 10 is constantly located above the bottom frame 24 in the side view shown in FIG. 3 even when the fan main body portion 10 pivotally supported by the support mechanism portion 21 pivots. Therefore, the cordless fan 1 is kept standing alone by grounding the bottom frames 24, even in a state where the rechargeable battery 30 is detached from the battery retaining portion 251.

In a state where the rechargeable battery 30 is attached to the battery retaining portion 251, the cordless fan 1 is more stable and difficult to fall down since the fan main body portion 10 and the rechargeable battery 30, which are large in mass, are disposed with a space from each other in a front-to-back direction. In addition, as shown in FIG. 3, the rechargeable battery 30 (at least the center of gravity thereof) occupying a large percentage (for example, about 40%) of a total mass of the cordless fan 1 is disposed lower than the support mechanism portion 21 supporting the fan main body portion 10. Therefore, the position of the center of gravity of the cordless fan 1 is lowered, so that the cordless fan. 1 becomes much more stable and more difficult to fall down.

In a self-standing state of the cordless fan 1 where the bottom frames 24 is grounded, as shown in FIG. 3, the top frame 23 and the connecting frame 25 are located behind the front face cover member 12 of the fan main body portion 10, and the rechargeable battery 30 attached to the battery retaining portion 251 provided in the connecting frame 25 is disposed with a space from a rear side having an air inlet port of the fan main body portion 10. Therefore, air blown from the front face cover member 12 of the fan main body portion 10 is not blocked by the top frame 23, the connecting frame 25, the battery retaining portion 251, and the rechargeable battery 30. Since no obstacles interfering with blowing air exist in front, a blowing direction can be vertically changed over a wide range on the front side by performing pivoting of the fan main body portion 10 supported pivotally by the support mechanism portion 21. Further, since the rechargeable battery 30 is disposed with a space behind the fan main body portion 10, an air current sucked into the rear of the fan main body portion 10 can cool the rechargeable battery 30.

In addition, in the self-standing state of the cordless fan 1 where the bottom frames 24 is grounded, as shown in FIG. 3, the top frame 23 is disposed substantially parallel with respect to the installation surface. Therefore, the top frame 23 is disposed at a position substantially above the fan main body portion 10 where it can be easily held by a user, and thus the top frame 23 functions as a handle for a user to hold and carry the cordless fan 1.

Figure 4A:
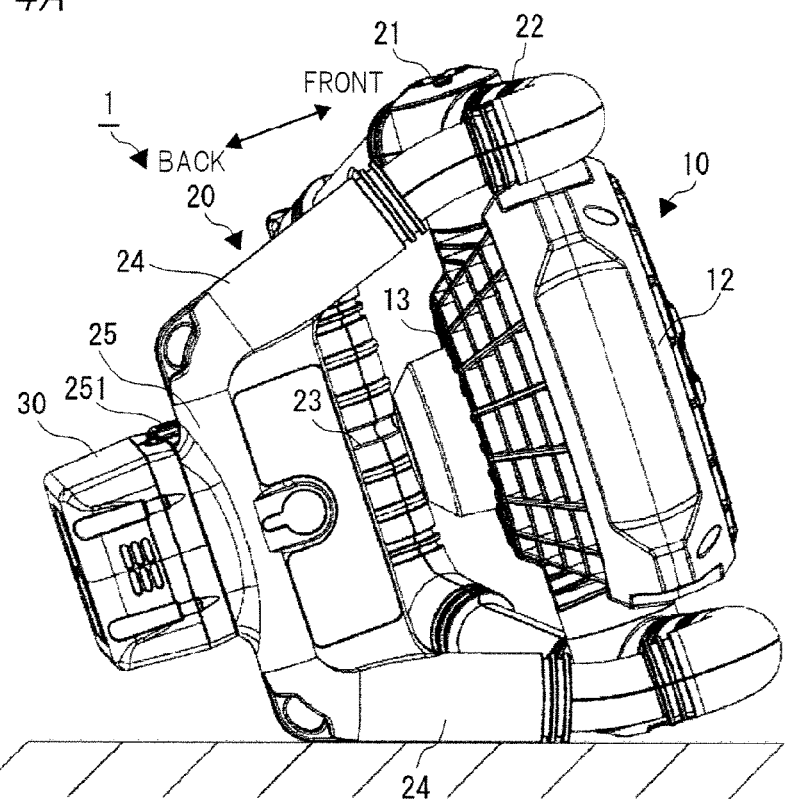
FIG. 4A is a perspective view showing a self-standing state of the cordless fan shown in FIG. 1 where a side frame and a bottom frame of the cordless fan are grounded.
Figure 4B:
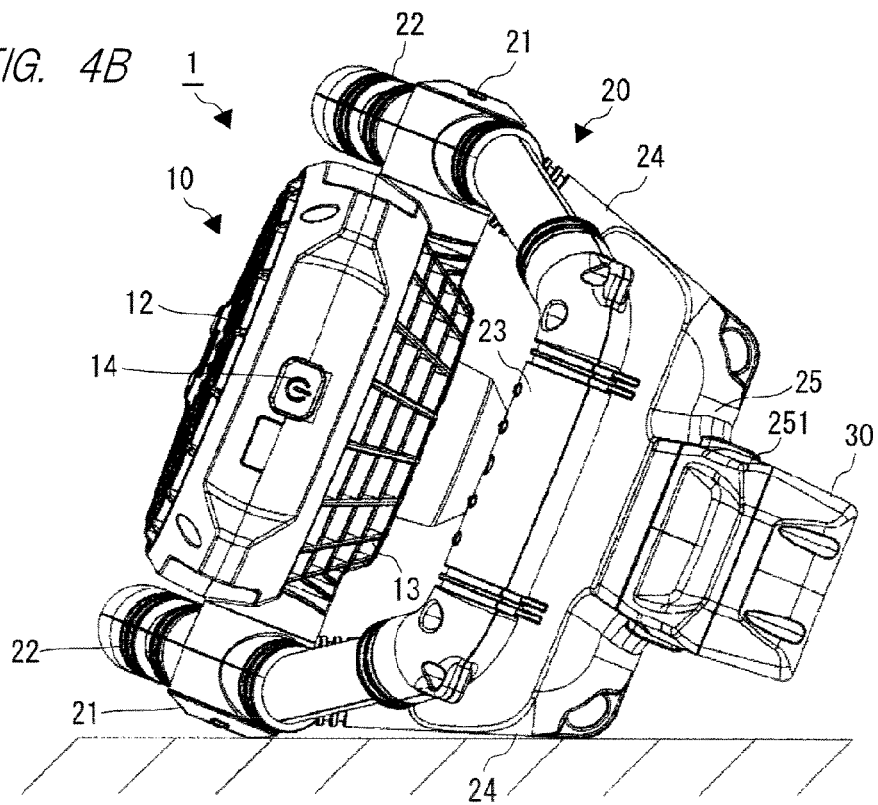
FIG. 4B is a perspective view showing a self-standing state of the cordless fan shown in FIG. 1 where a side frame and a bottom frame of the cordless fan are grounded.

Since the side frame 22 and the bottom frame 24 are connected to each other in a substantially L shape in the side view shown in FIG. 3, the cordless fan 1 can be stood alone by grounding one of the side frames 22 and the bottom frames 24, as shown in FIG. 4. It should be noted that FIG. 4A is a drawing of the cordless fan 1 as viewed from the bottom frame 24 side, and that FIG. 4B is a drawing of the cordless fan 1 as viewed from the top frame 23 side. A space between the pair of bottom frames 24 is narrower on the rear side than on the front side, as shown in FIG. 4A. Therefore, when the cordless fan 1 is stood alone by grounding the side frames 22 and the bottom frames 24, the fan main body portion 10 is inclined such that the front face cover member 12 faces upward, and the blowing direction becomes obliquely upward. Then, by pivoting the fan main body portion 10 supported pivotally by the support mechanism portion 21 in the state shown in FIG. 4, the blowing direction can be changed horizontally.

Figure 5:
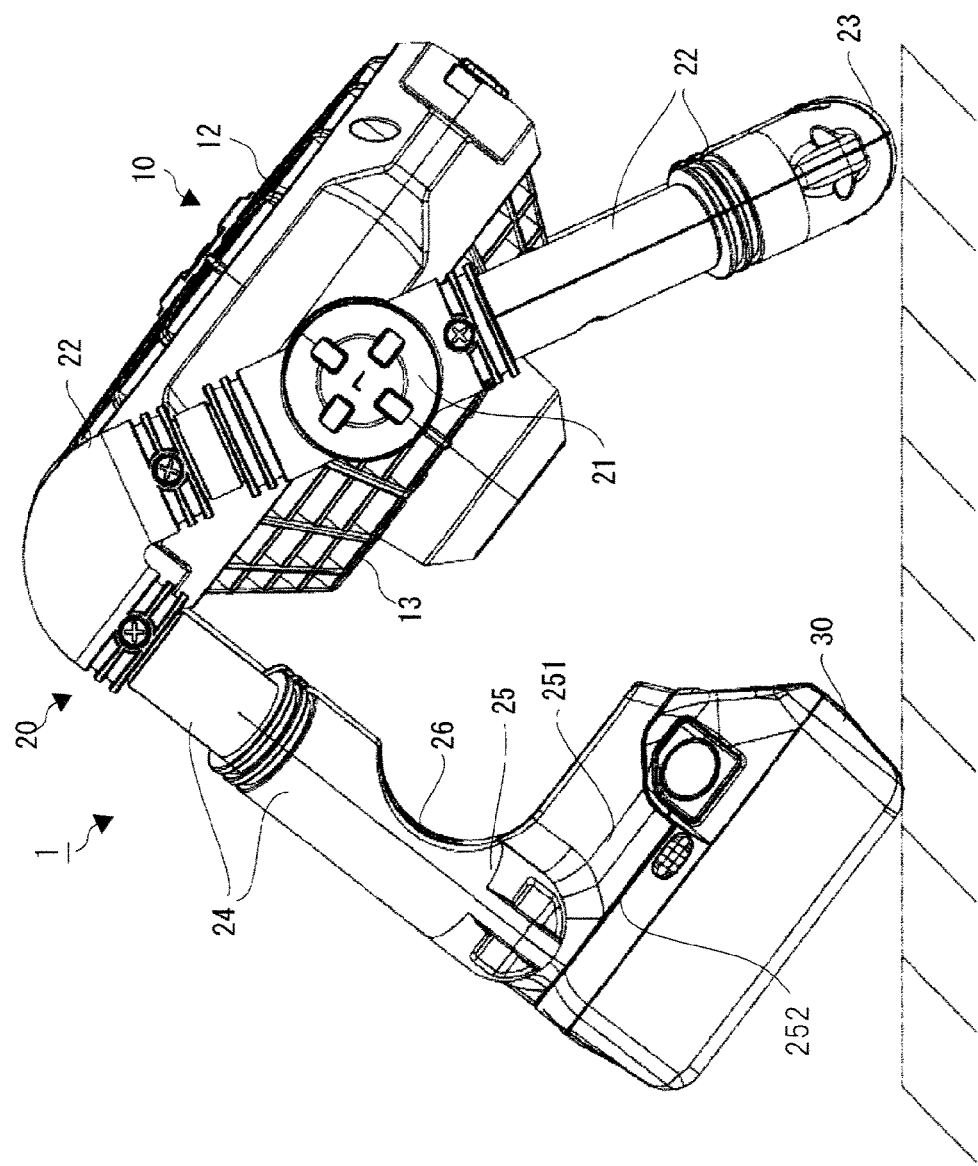
FIG. 5 is a perspective view showing a self-standing state of the cordless fan shown in FIG. 1 where a top frame and a rechargeable battery of the cordless fan are grounded.
Figure 6:
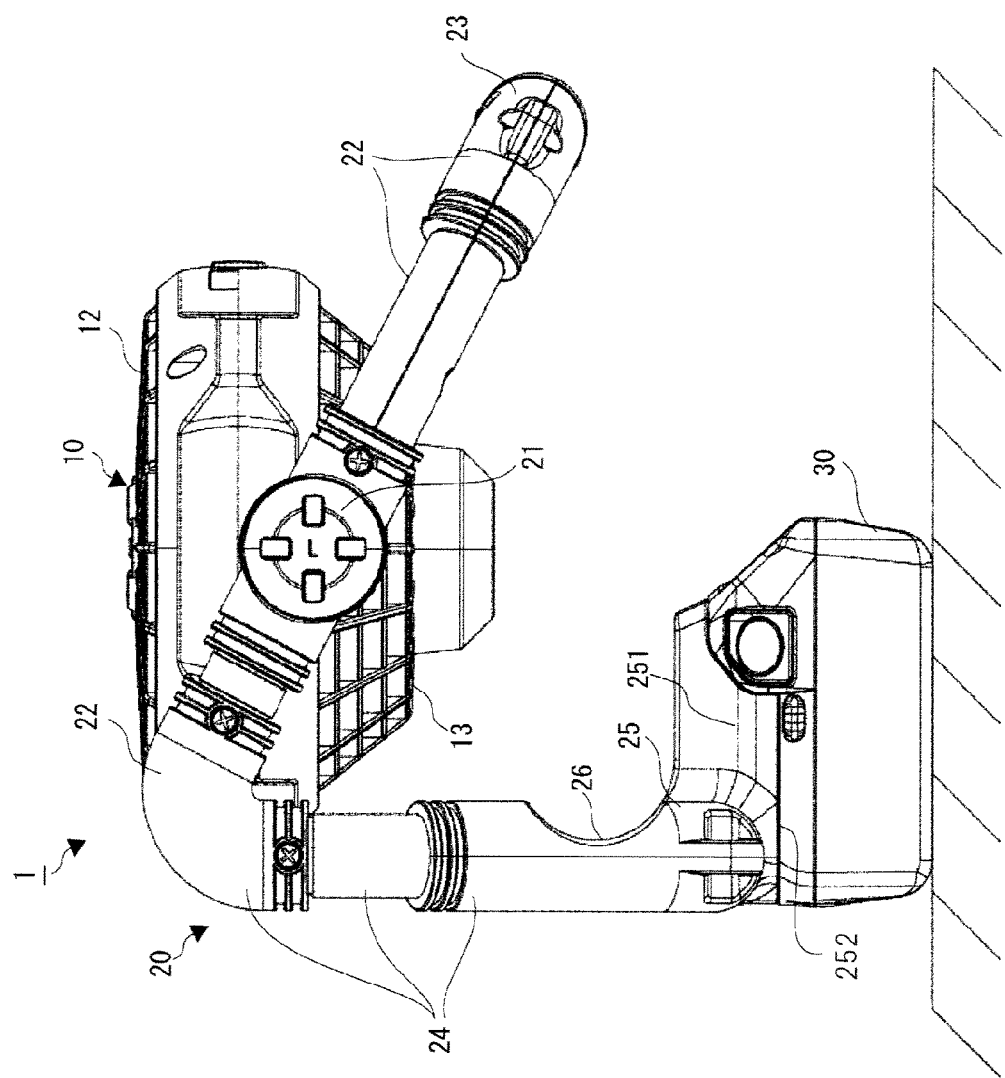
FIG. 6 is a perspective view showing a self-standing state of the cordless fan shown in FIG. 1 where a back face of the rechargeable battery of the cordless fan is grounded.

Further, the cordless fan 1, as shown in FIG. 5, can be stood alone by grounding the top frame 23 and the rechargeable battery 30 attached to the battery retaining portion 251, or, as shown in FIG. 6, can be stood alone by grounding only the back face of the rechargeable battery 30 attached to the battery retaining portion 251. In both cases shown in FIGS. 5 and 6, since the rechargeable battery 30, which occupies a large percentage (for example, about 40%) of the total mass, is grounded as a foot, the cordless fan 1 is more stable, and difficult to fall down.

With reference to FIG. 3, a recess 26 is formed in an upper face of the bottom frame 24 in the vicinity of the connecting frame 25. The recess 26 is composed of a partially-cylindrical curved surface having an axial direction substantially parallel with respect to the pivot of the fan main body portion 10 supported pivotally by the support mechanism portion 21. A radius of curvature R of the recess 26 is set at a radius of curvature R=24.3 mm in accordance with a diameter of 48.6 mm that is a standard of a single pipe used as a scaffolding material in a construction site. Further, a face of the connecting frame 25 positioned on the side of the fan main body portion 10 constitutes a part of the recess 26, and the connecting frame 25 also abuts on a single pipe spanning each of the recesses 26 formed in the pair of bottom frames 24. In addition, a face of the battery retaining portion 251 provided in the connecting frame 25, the face being positioned on the side of the fan main body portion 10, forms an angle of about 90 degrees with the bottom frame 24, and is formed so as to be continuous from the recesses 26 in a direction of increasing the distance from the bottom frame 24.

Figure 7:
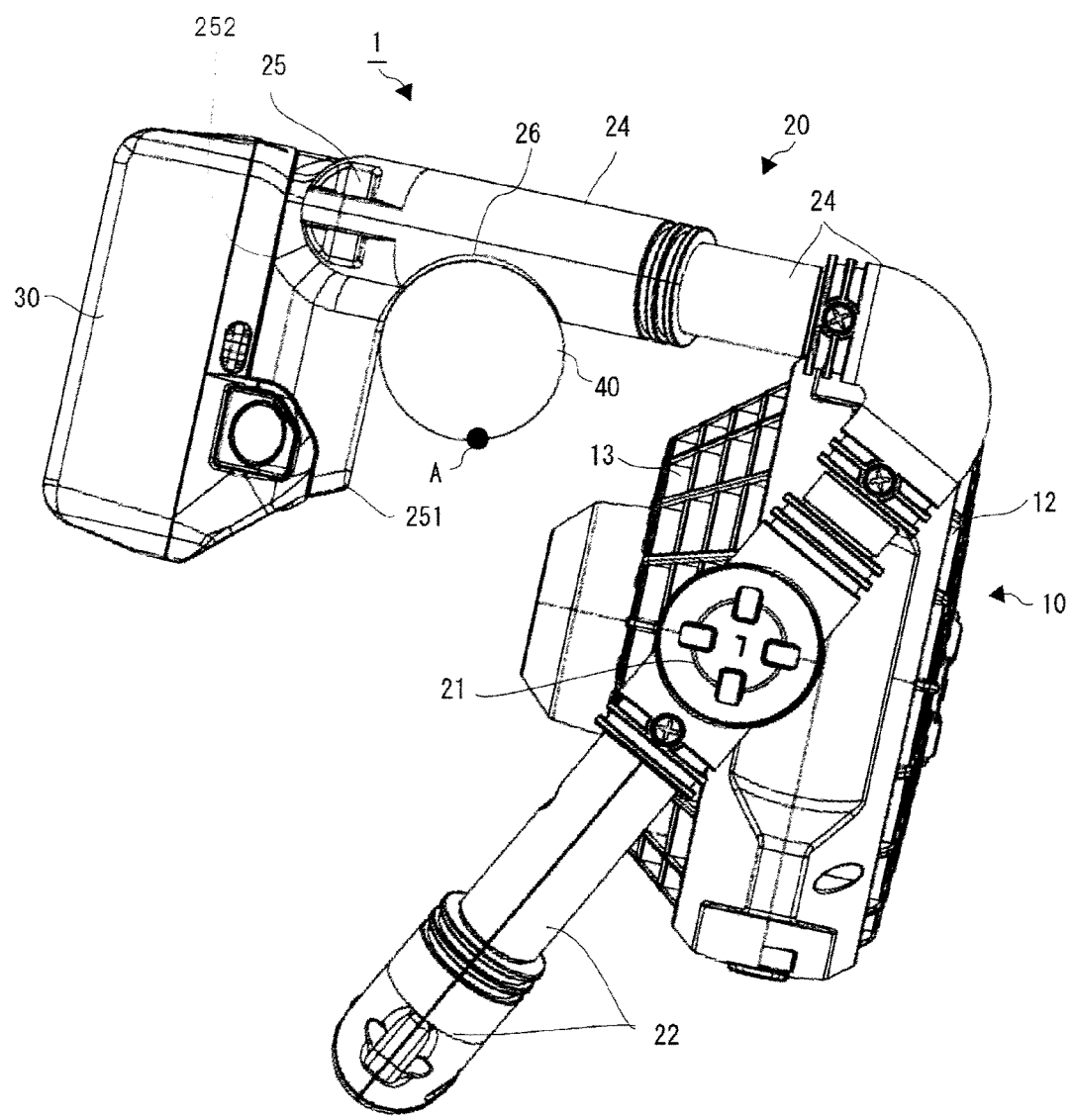
FIG. 7 is a side view showing a hanging state of the cordless fan shown in FIG. 1.
Figure 8:
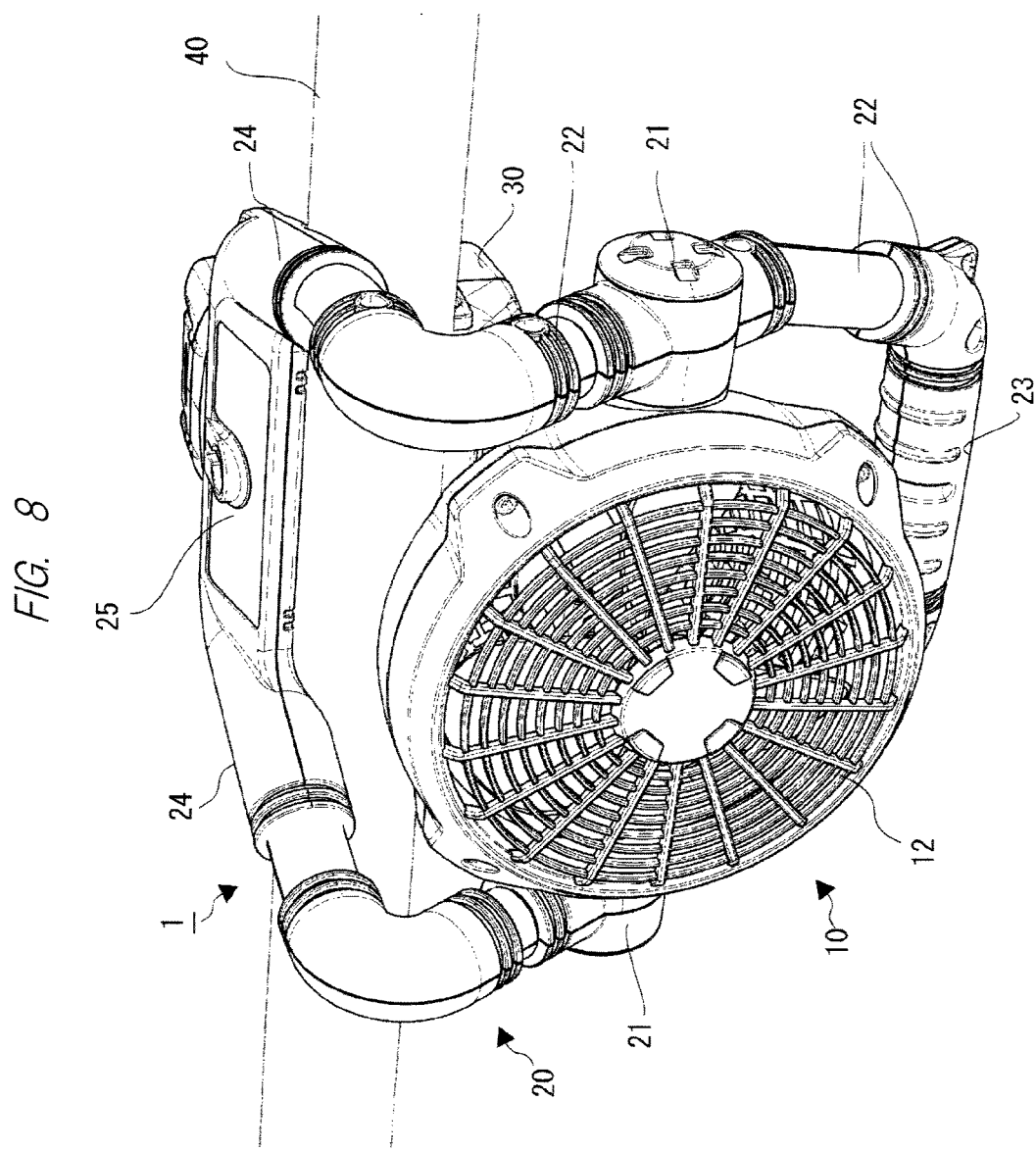
FIG. 8 is a perspective view showing a hanging state of the cordless fan shown in FIG. 1.

The recess 26 functions as a hook-like portion (hook) upon hanging the cordless fan 1. As shown in FIGS. 7 and 8, by turning the cordless fan 1 upside down from the state shown in FIGS. 1 to 3 and hanging the recess 26 on a single pipe (external member) 40 that is substantially horizontally spanned, the cordless fan 1 can be used in the state of being hung on the single pipe 40. Point A shown in FIG. 7 is a position of the center of gravity as viewed from a side face of the cordless fan 1 having the rechargeable battery 30 (rechargeable battery of large size) with a rated voltage of 18 V attached. In this case, a percentage of the rechargeable battery 30 occupying the total mass is about 40%, and, in the cordless fan 1 hung on the single pipe 40, the fan main body portion 10 and the rechargeable battery 30, which are heavy members, substantially balance each other around the single pipe 40. Therefore, as shown in FIG. 7, the bottom frames 24 become almost horizontal, so that an entire surface of each of the recesses 26 formed in the pair of bottom frames 24, abuts on an upper face of the single pipe 40 with a space in an axial direction of the single pipe 40, and the pivot shaft of the cordless fan 1 is positioned substantially parallel with respect to the single pipe 40, so that the position of the cordless fan 1 is stabilized. Further, since the recess 26 is composed of a partially-cylindrical curved surface, the cordless fan 1 can easily be moved horizontally 40 by moving the cordless fan 1 along the single pipe 40 in a state where the recess 26 is abutted on the single pipe 40.

Figure 9:
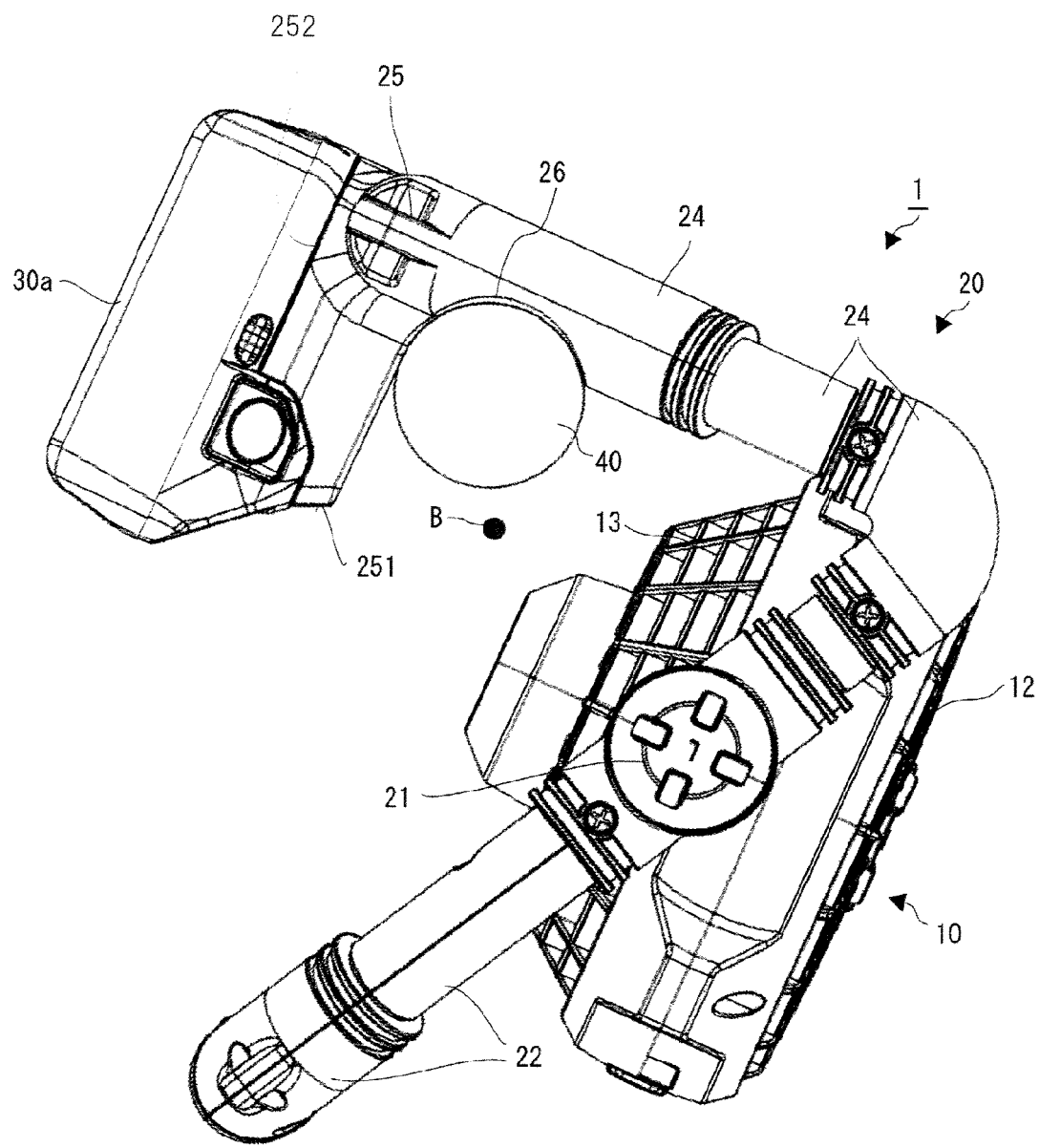
FIG. 9 is a side view showing a hanging state of the cordless fan shown in FIG. 1 having a small-sized rechargeable battery attached.

In this embodiment, the battery retaining portion 251 is configured to have two types of rechargeable batteries attached: the rechargeable battery 30 having a rated voltage of 18 V and a rechargeable battery 30a having a rated voltage of 14.4 V. FIG. 9 shows a state where the cordless fan 1 having the rechargeable battery 30a with a rated voltage of 14.4 V (rechargeable battery of small size) attached is hung on the single pipe 40. Point 3 shown in FIG. 9 is a position of the center of gravity as viewed from a side face of the cordless fan 1 having the rechargeable battery 30a with a rated voltage of 14.4 V attached. A percentage of the rechargeable battery 30a occupying the total mass is smaller than the percentage of the rechargeable battery 30 shown in FIG. 7, and the cordless fan 1 hung on the single pipe 40 is consequently inclined a little to the fan main body portion 10 side; nevertheless, the entire surface of the recess 26 abuts on the upper face of the single pipe 40. In other words, regardless of whether the cordless fan 1 is hung in the state where the rechargeable battery 30 (heavier) is attached to the battery retaining portion 251 or in the state where the rechargeable battery 30a (lighter) is attached thereto, a balance of weight between the fan main body portion 10 and the rechargeable battery 30 (30a) located on both sides of the single pipe 40 is set so that the entire surface of the recess 26 abuts on the upper surface of the single pipe 40.

Figure 10:
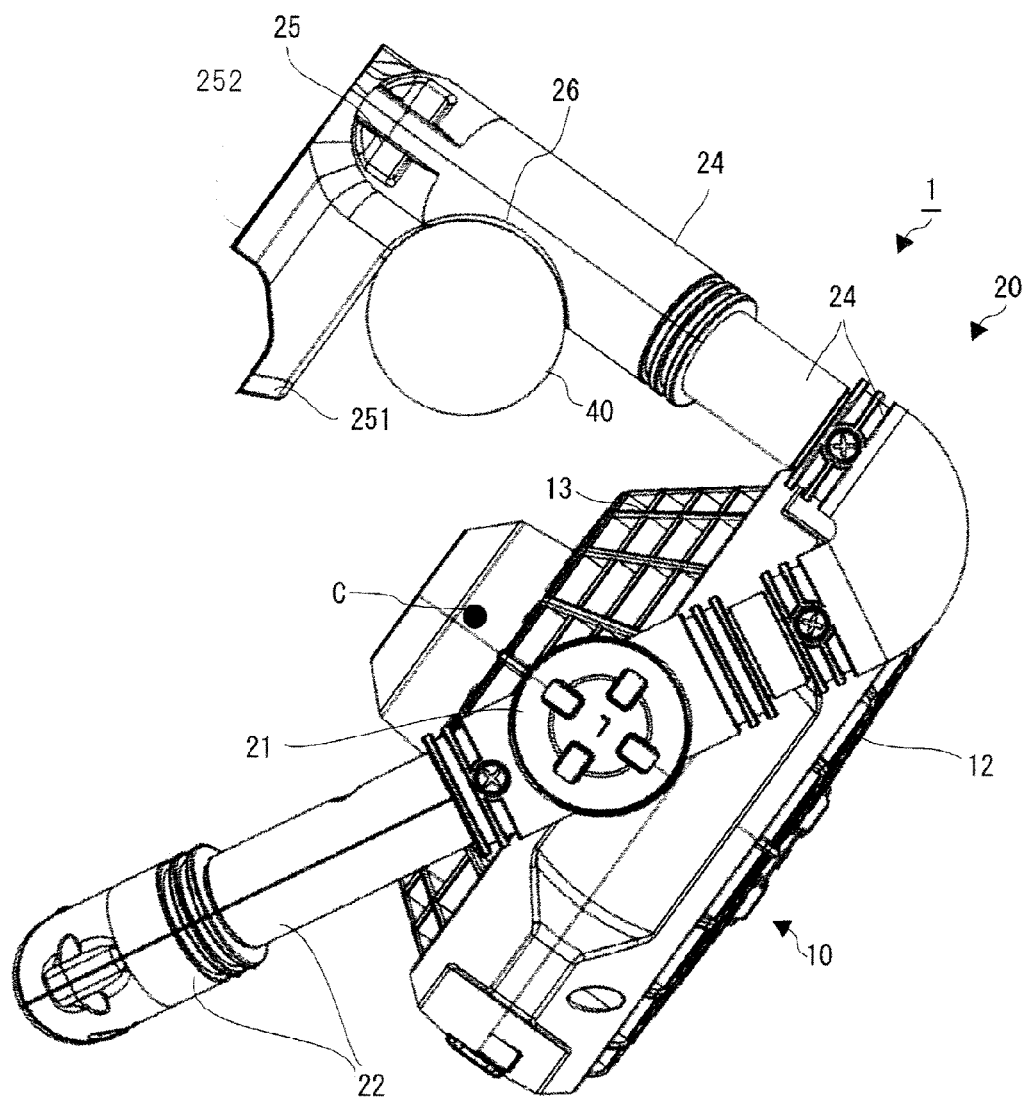
FIG. 10 is a side view showing a hanging state of the cordless fan shown in FIG. 1 from which a rechargeable battery is detached.

FIG. 10 shows a state where the cordless fan 1 from which the rechargeable battery 30 (30a) is detached is hung on the single pipe 40. Point C shown in FIG. 10 is a position of the center of gravity as viewed from a side face of the cordless fan 1 from which the rechargeable battery 30 (30a) is detached. In this case, the cordless fan 1 hung on the single pipe 40 is inclined significantly to the fan main body portion 10 side, but, since the face of the battery retaining portion 251 positioned on the side of the fan main body portion 10 is formed continuously from the recess 26, a little vibration cannot cause the cordless fan 1 to fall from the single pipe 40. Therefore, the rechargeable battery 30 (30a) can easily be attached to or detached from the cordless fan 1 in a state where the cordless fan 1 is hung on the single pipe 40.

Figure 11:
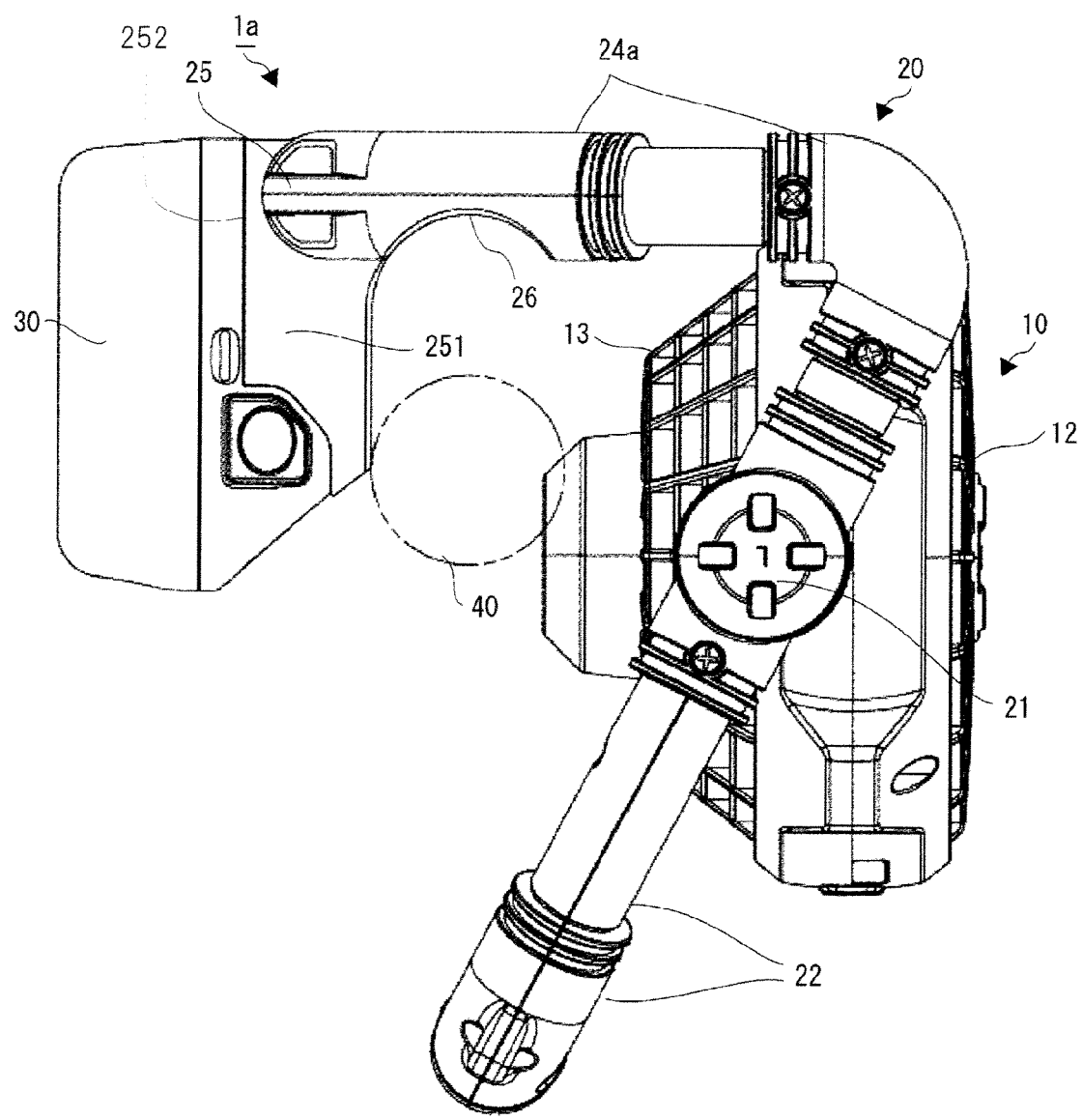
FIG. 11 is a side view showing a configuration of an embodiment of a cordless fan according to the present invention, where bottom frames with a short length are adopted.
Figure 12:
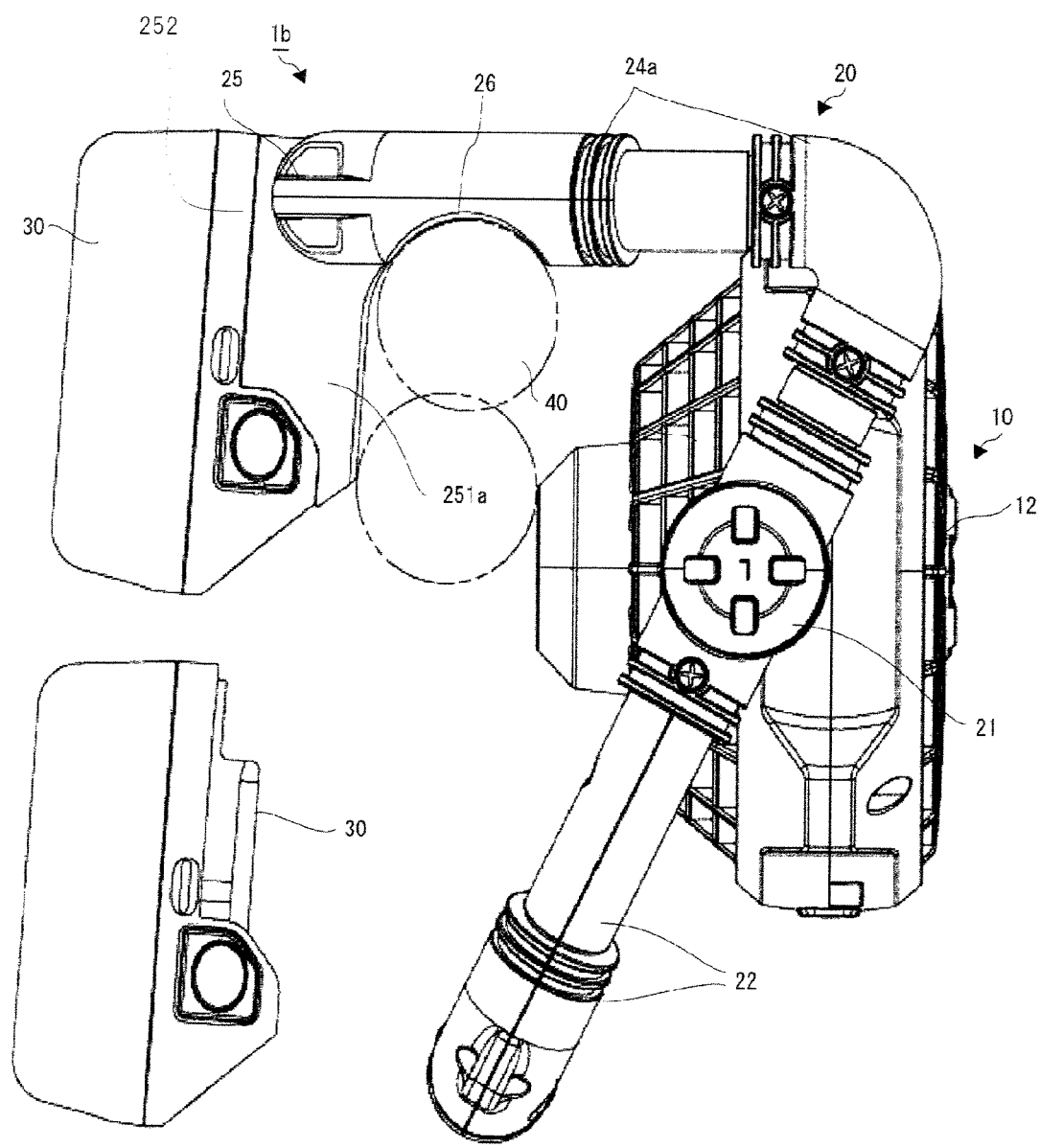
FIG. 12 is a side view showing a configuration of another embodiment of a cordless fan that is an electrical apparatus according to the present invention.

It should be noted that, as shown in FIG. 11, in the case of a cordless fan 1a adopting a bottom frame 24a with a short length for a downsizing purpose, a space between the fan main body portion 10 and the battery retaining portion 251 becomes narrower, so that it becomes difficult to guide the single pipe 40 to the recess 26 even if it is tried to hang the cordless fan 1a on the single pipe 40. Therefore, if the bottom frames 24a with a short length are adopted, it is preferred that the battery retaining portion be provided obliquely to the connecting frame 25 such that a distance from the fan main body portion 10 is increased from a proximal end of the battery retaining portion to a distal end thereof regarding a face of the battery retaining portion positioned on the side of the fan main body portion 10, like a battery retaining portion 251a of a cordless fan 1b shown in FIG. 12. In this case, a sufficient space between the fan main body portion 10 and the battery retaining portion 251A is secured, so that the single pipe 40 can easily be guided to the recess 26 by moving the single pipe 40 along the face of the battery retaining portion 251a positioned on the side of the fan main body portion 10.

Figure 13:
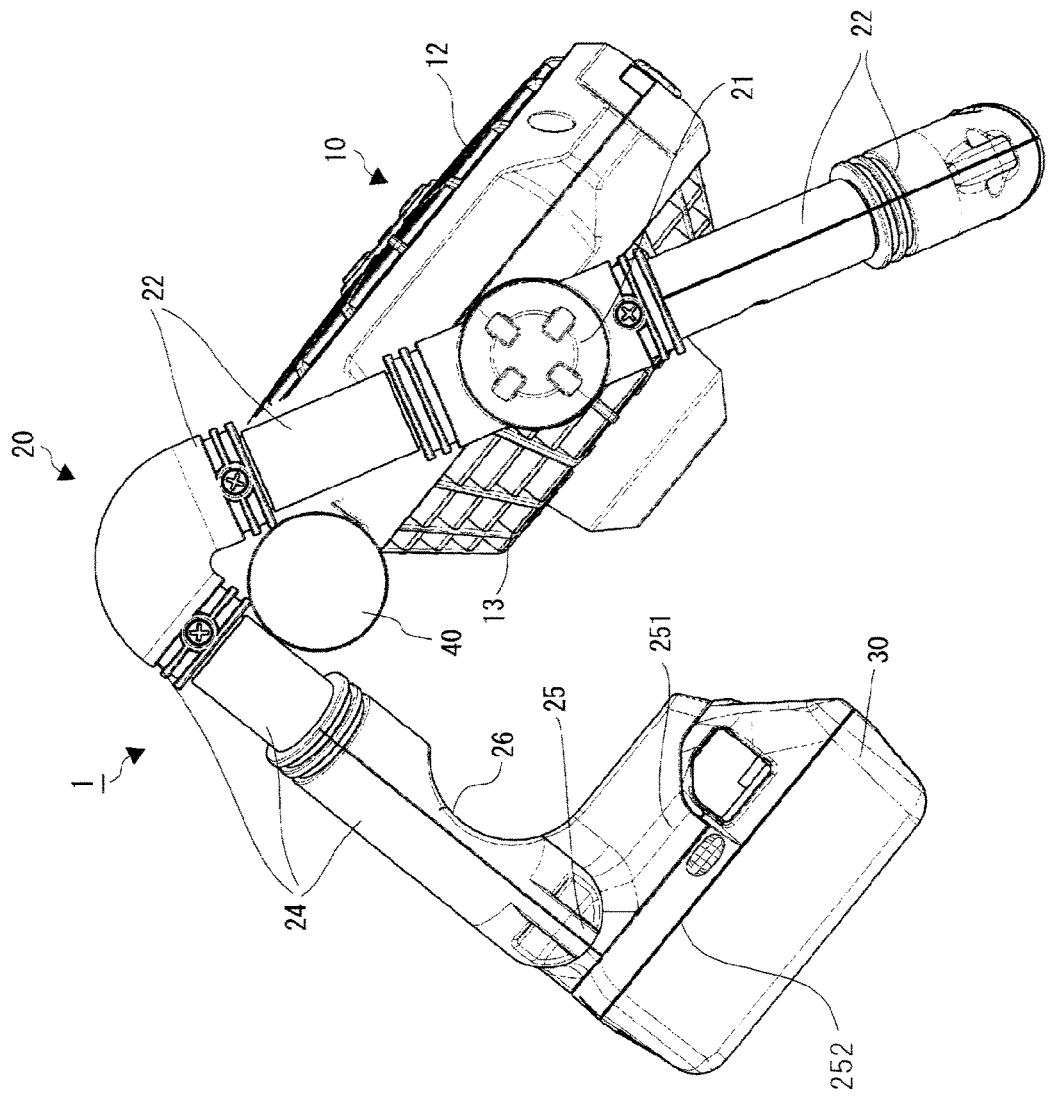
FIG. 13 is a side view showing a hanging state of the cordless fan shown in FIG. 1 with use of a side frame and a bottom frame.

Further, the side frame 22 and the bottom frame 24 are connected to each other in a substantially L shape in the side view shown in FIG. 3. Therefore, as shown in FIG. 13, the cordless fan 1 can be used in the state of being hung on the single pipe 40 by causing a connecting portion between the side frame 22 and the bottom frame 24 to function as a hook portion to hang the connecting portion on the single pipe 40. In this case, similarly, the fan main body portion 10 and the rechargeable battery 30, which are heavy members, are disposed centering around the single pipe 40, and balanced with each other.

As described above, according to this embodiment, an electrical apparatus of the present invention includes the bottom frame 24 and the connecting frame 25 functioning as a first frame portion brought in contact with an installation surface in an ordinary state, the top frame 23 functioning as a second frame portion joined to the bottom frame 24 via a side frame 22, and a battery retaining portion 251 provided in the connecting frame 25 and having a rechargeable battery 30 attached thereto, where the electrical apparatus is configured to be able to be used in the state where the bottom frame 24 and the connecting frame 25 are installed on the installation surface, and where the rechargeable battery 30 attached to the battery retaining portion 251 and the top frame 23 are installed on the installation surface.

Further, according to this embodiment, the electrical apparatus of the present invention includes the bottom frame 24 and the connecting frame 25 functioning as a first frame portion brought in contact with an installation surface in an ordinary state, and the battery retaining portion 251 provided in the bottom frame 24 via the connecting frame 25 and having a rechargeable battery 30 attached thereto, where the electrical apparatus is configured to be able to be used in the state where the bottom frame 24 and the connecting frame 25 are installed on the installation surface, and where only the rechargeable battery 30 attached to the battery retaining portion 251 is installed on the installation surface.

Further, according to this embodiment, the electrical apparatus of the present invention includes the fan main body portion 10 converting electrical power into wind to output the converted wind from a front face side to an outside of the fan main body portion, the pair of side frames 22 supporting the fan main body portion 10, the pair of bottom frames 24 extending from lower ends of the side frames 22 to a rear side, the connecting frame 25 connecting the pair of bottom frames 24, and the battery retaining portion 251 having a rechargeable battery 30 for supplying electrical power to the fan main body portion 10 detachably attached thereto, where the battery retaining portion 251 is provided in the connecting frame 25 and disposed with a space from an air inlet port at a rear face of the fan main body portion 10.

With these configurations, since the fan main body portion 10 and the rechargeable battery 30, which are heavy members, are disposed with a space from each other in a front-to-back direction, the electrical apparatus becomes more stable and difficult to fall down. In the case of grounding the rechargeable battery 30 and the top frame 23, the center of gravity of the electrical apparatus is located between the rechargeable battery 30 and the top frame 23, and the electrical apparatus therefore becomes difficult to fall down. Further, since the electrical apparatus can be installed in various aspects, the installation position of the electrical apparatus can be changed according to an intended purpose. Further, in the case of grounding the rechargeable battery 30, the center of gravity of the electrical apparatus is located above the rechargeable battery 30, so that the electrical apparatus becomes difficult to fall down. In addition, an air current sucked into a rear of the fan main body portion 10 can cool the rechargeable battery 30.

Furthermore, according to this embodiment, the attachment portion 252 for the rechargeable battery 30 is formed at a rear side of the battery retaining portion 251.

With this configuration, in a self-standing state of the electrical apparatus where the bottom frame 24 is grounded, a user can easily perform attachment and detachment of the rechargeable battery 30, viewing the attachment portion 252 of the battery retaining portion 251.

Furthermore, according to this embodiment, in a self-standing state of the electrical apparatus where the pair of bottom frames 24 are grounded, the center of gravity of the rechargeable battery 30 attached to the battery retaining portion 251 is located lower than positions (positions of the support mechanism portions 21) where the fan main body portion 10 is supported by the pair of side frames 22.

With this configuration, the position of the center of gravity of the cordless fan 1 is lowered, and the cordless fan 1 therefore becomes more stable and difficult to fall.

Further, according to this embodiment, the fan main body portion 10 is pivotally supported by each of the support mechanism portions 21 built in the pair of side frames.

With this configuration, in a stable state of the cordless fan 1 with a lowered position of the center of gravity, the blowing direction can easily be changed.

Further, according to this embodiment, the partially-cylindrical recesses 26 having an axial direction substantially parallel with respect to a pivot shaft (supporting shaft) of the fan main body portion 10 supported by the pair of side frames 22 are formed at upper faces of the pair of bottom frames 24 in the vicinity of the connecting frame 25.

With this configuration, the recess 26 functions as a hook-like portion (hook) upon hanging the cordless fan 1, and the cordless fan 1 can therefore be used in a state where the cordless fan 1 is hung on the single pipe 40 by turning the cordless fan 1 upside down from the state shown in FIGS. 1 to 3 and hanging the recess 26 on the single pipe 40 that is substantially horizontally spanned. In this case, the fan main body portion 10 and the rechargeable battery 30, which are heavy members, are substantially balanced with each other around the single pipe 40, so that the position of the cordless fan 1 becomes stable.

Further, according to this embodiment, a face of the battery retaining portion 251 positioned on the side of the fan main body portion 10 is formed so as to be continuous from the recesses 26 in a direction of increasing a distance from the bottom frame 24.

With this configuration, a little vibration cannot cause the cordless fan 1 to fall down from the single pipe 40. Therefore, the rechargeable battery 30 (30a) can easily be attached to or detached from the cordless fan 1 in a state where the cordless fan 1 is hung on the single pipe 40.

Further, according to this embodiment, a face of the battery retaining portion 251a (see FIG. 12) positioned on the side of the fan main body portion 10 is formed such that a distance from the fan main body portion 10 is increased from a proximal end of the battery retaining portion to a distal end thereof.

With this configuration, a sufficient space between the fan main body portion 10 and the battery retaining portion 251a is secured even when the bottom frames 24a of short length are adopted for a downsizing purpose, so that the single pipe 40 can easily be guided to the recess 26 by moving the single pipe 40 along the face of the battery retaining portion 251a positioned on the side of the fan main body portion 10.

In addition, according to this embodiment, the electrical apparatus of the present invention includes the fan main body portion 10 converting electrical power into wind to output the converted wind from a front face side thereof to an outside of the main body portion, the frame portion 20 having the pair of side frames 22 supporting the fan main body portion 10, the pair of bottom frames 24 extending from rear ends of the pair of side frames 22 to a rear side, and the connecting frame 25 connecting the pair of bottom frames 24, and the battery retaining portion 251 provided in the frame portion 20 and having the rechargeable battery 30 for supplying electrical power to the fan main body portion 10 detachably attached thereto, where the frame portion 20 between the battery retaining portion 251 and the fan main body portion 10 functions as a hook portion so as to be hung on an external member (single pipe 40).

Further, according to this embodiment, in the state where the bottom frames 24 are grounded, the side frames 22 and the battery retaining portion 25 are configured to extend upward, and the hook portion is configured to be located in a space formed by the fan main body portion 10, the battery retaining portion 251, and the frame portion 20.

Further, according to this embodiment, the hock portion is provided in the connecting portion between the bottom frame 24 and the battery retaining portion 251.

Further, according to this embodiment, the front face side (the fan main body portion 10 side) of the battery retaining portion 251 is inclined rearward with respect to the bottom frames 24 (the opposite side of the fan main body portion 10 side).

Furthermore, according to this embodiment, the hook portion is provided in the connecting portion between the side frame 22 and the bottom frame 24 (see FIG. 13).

The present invention is described based on the embodiment. The present embodiment is intended to be illustrative only and it will be obvious to those skilled in the art that various modifications to constituting elements could be developed and that such modifications are also within the scope of the present invention.

For example, the present invention is applicable to an electrical apparatus converting electrical power into either one of light, heat, and sound to output the converted one to the outside.

As the electrical apparatus converting electrical power into light to output the light, the present invention is not limited to a projector provided with an LED converting electrical power into light, but also applicable to a video reproducer, such as a television or a DVD player, using liquid crystals and a liquid crystal panel as a converting part converting electrical power into light and an output part outputting the converted light to the outside, respectively.

As the electrical apparatus converting electrical power into heat to output the heat, the present invention is applicable to a heat converter, such as a heater or a cooler, using a heat converter and a guard mesh of the heat converter as a converting part converting electrical power into heat and an output part outputting the converted heat to the outside, respectively.

As the electrical apparatus converting electrical power into sound to output the sound, the present invention is applicable to acoustic equipment, such as a speaker, an electric megaphone, or a radio receiver, using a speaker and a dustproof net of the speaker as a converting part converting electrical power into sound and an output part outputting the converted sound to the outside, respectively.

What is claimed is:

1. An electrical apparatus comprising:
    a main body portion converting electrical power into either one of light, wind, heat, and sound to output the converted one from a front face side to an outside of the main body portion;
    a pair of side frames supporting the main body portion;
    a pair of bottom frames extending from lower ends of the pair of side frames to a rear side;
    a connecting frame connecting the pair of bottom frames; and
    a battery retaining portion having a rechargeable battery for supplying electrical power to the main body portion, the rechargeable battery being detachably attached to the battery retaining portion,
    wherein the battery retaining portion is provided in the connecting frame and disposed having a space from a rear face of the main body portion, and
    wherein partially-cylindrical recesses having an axial direction substantially parallel with respect to a supporting shaft of the main body portion supported by the pair of side frames are formed at upper faces of the pair of bottom frames in vicinity of the connecting frame.

2. The electrical apparatus according to claim 1, wherein an attachment portion for the rechargeable battery is formed at a rear side of the battery retaining portion.

3. The electrical apparatus according to claim 1, wherein, in a self-standing state of the electrical apparatus where the pair of bottom frames are grounded, a center of gravity of the rechargeable battery attached to the battery retaining portion is disposed lower than a point where the main body portion is supported by the pair of side frames.

4. The electrical apparatus according to claim 3, wherein the main body portion is pivotally supported by each of support mechanism portions built in the pair of side frames.

5. The electrical apparatus according to claim 1,
wherein a face of the battery retaining portion positioned on the side of the main body portion is formed so as to be continuous from the recesses in a direction of increasing a distance from the bottom frames.

6. The electrical apparatus according to claim 1,
wherein a face of the battery retaining portion positioned on the side of the main body portion is formed such that a distance from the main body portion is increased from a proximal end of the battery retaining portion to a distal end thereof.

7. An electrical apparatus comprising:
a main body portion converting electrical power into either one of light, wind, heat, and sound to output the converted one from a front face side to an outside of the main body portion;
a frame portion having a pair of side frames supporting the main body portion, a pair of bottom frames extending from lower ends of the pair of side frames to a rear side, and a connecting frame connecting the pair of bottom frames; and
a battery retaining portion provided in the frame portion and having a rechargeable battery for supplying electrical power to the main body portion, the rechargeable battery being detachably attached to the battery retaining portion, wherein
the bottom frames respectively has upper surfaces each having a recess between the battery retaining portion and the main body portion so that each recess functions as a hook portion for the electrical apparatus to be hung on an external member.

8. The electrical apparatus according to claim 7, wherein,
in a state where the bottom frames are grounded, the side frames and the battery retaining portion are configured to extend upward, and
the hook portion is configured to be located in a space formed by the main body portion, the battery retaining portion, and the frame portion.

9. The electrical apparatus according to claim 8, wherein the hook portion is provided in a connecting portion between the bottom frame and the battery retaining portion.

10. The electrical apparatus according to claim 9, wherein a front face side of the battery retaining portion is inclined rearward with respect to the bottom frames.

11. The electrical apparatus according to claim 8, wherein the hook portion is provided in a connecting portion between the side frame and the bottom frame.

* * * * *